United States Patent
Joshi et al.

(10) Patent No.: US 9,385,025 B2
(45) Date of Patent: Jul. 5, 2016

(54) E-FUSES CONTAINING AT LEAST ONE UNDERLYING TUNGSTEN CONTACT FOR PROGRAMMING

(71) Applicant: GLOBALFOUNDRIES INC., Grand Cayman (KY)

(72) Inventors: Rajiv V. Joshi, Yorktown Heights, NY (US); Chih-Chao Yang, Glenmont, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/573,268

(22) Filed: Dec. 17, 2014

(65) Prior Publication Data

US 2015/0099356 A1 Apr. 9, 2015

Related U.S. Application Data

(62) Division of application No. 13/298,872, filed on Nov. 17, 2011, now Pat. No. 8,941,110.

(51) Int. Cl.
*H01L 23/525* (2006.01)
*H01L 21/768* (2006.01)
(Continued)

(52) U.S. Cl.
CPC .......... *H01L 21/768* (2013.01); *H01L 23/5256* (2013.01); *H01L 23/53257* (2013.01); *H01L 27/11206* (2013.01); *H01L 27/2463* (2013.01); *H01L 45/04* (2013.01); *H01L 45/06* (2013.01);
(Continued)

(58) Field of Classification Search
CPC .................................................. H01L 23/5256

USPC .......................................... 257/529; 438/132
See application file for complete search history.

(56) References Cited

U.S. PATENT DOCUMENTS

| 4,227,168 | A | 10/1980 | Knapp, Jr. |
| 4,228,417 | A | 10/1980 | Belcher |

(Continued)

FOREIGN PATENT DOCUMENTS

JP  2000223574  8/2000

OTHER PUBLICATIONS

Kothandaraman, C., et al. "Electrically Programmable Fuse (eFUSE) Using Electromigration in Silicides", IEEE Electron Device Letters, Sep. 2002, vol. 23, No. 9.

(Continued)

*Primary Examiner* — Evan Pert
(74) *Attorney, Agent, or Firm* — Scully, Scott, Murphy & Presser, P.C.

(57) ABSTRACT

Semiconductor structures are provided containing an electronic fuse (E-fuse) that includes a fuse element and at least one underlying tungsten contact that is used for programming the fuse element. In some embodiments, a pair of neighboring tungsten contacts is used for programming the fuse element. In another embodiment, an overlying conductive region can be used in conjunction with one of the underlying tungsten contacts to program the fuse element. In the disclosed structures, the fuse element is in direct contact with upper surfaces of a pair of underlying tungsten contacts. In one embodiment, the semiconductor structures may include an interconnect level located atop the fuse element. The interconnect level has a plurality of conductive regions embedded therein. In other embodiments, the fuse element is located within an interconnect level that is located atop the tungsten contacts.

9 Claims, 4 Drawing Sheets

(51) Int. Cl.
*H01L 45/00* (2006.01)
*H01L 27/24* (2006.01)
*H01L 23/532* (2006.01)
*H01L 27/112* (2006.01)
*H01L 23/522* (2006.01)

(52) U.S. Cl.
CPC .......... *H01L 45/1266* (2013.01); *H01L 45/142* (2013.01); *H01L 45/143* (2013.01); *H01L 45/144* (2013.01); *H01L 45/146* (2013.01); *H01L 45/148* (2013.01); *H01L 23/5226* (2013.01); *H01L 2924/0002* (2013.01)

(56) References Cited

U.S. PATENT DOCUMENTS

| | | | |
|---|---|---|---|
| 4,240,058 A | 12/1980 | Kozacka et al. | |
| 4,245,208 A | 1/1981 | Belcher | |
| 4,254,394 A | 3/1981 | Kozacka et al. | |
| 4,272,752 A | 6/1981 | Jacobs, Jr. | |
| 4,306,212 A | 12/1981 | Belcher | |
| 4,647,340 A | 3/1987 | Szluk et al. | |
| 4,740,485 A | 4/1988 | Sharpe-Geisler | |
| 5,663,590 A * | 9/1997 | Kapoor | H01L 21/76888 257/529 |
| 5,882,998 A | 3/1999 | Sur, Jr. et al. | |
| 5,969,404 A | 10/1999 | Bohr et al. | |
| 6,097,077 A | 8/2000 | Gordon et al. | |
| 6,162,686 A * | 12/2000 | Huang | H01L 23/5258 257/503 |
| 6,259,146 B1 | 7/2001 | Giust et al. | |
| 6,472,253 B1 | 10/2002 | Bothra | |
| 6,692,994 B2 | 2/2004 | Davis et al. | |
| 6,750,129 B2 | 6/2004 | Yang et al. | |
| 6,754,135 B2 | 6/2004 | Pilo | |
| 6,784,045 B1 | 8/2004 | Price et al. | |
| 6,897,543 B1 | 5/2005 | Huang et al. | |
| 6,998,865 B2 | 2/2006 | Bard et al. | |
| 7,087,975 B2 | 8/2006 | Lehmann et al. | |
| 7,157,782 B1 | 1/2007 | Shih et al. | |
| 7,272,067 B1 | 9/2007 | Huang et al. | |
| 7,298,639 B2 | 11/2007 | Hsu et al. | |
| 7,388,273 B2 | 6/2008 | Burr et al. | |
| 7,450,411 B2 | 11/2008 | Lung et al. | |
| 7,470,929 B2 | 12/2008 | Hsu et al. | |
| 7,491,585 B2 | 2/2009 | Yang et al. | |
| 7,642,176 B2 | 1/2010 | Cheng et al. | |
| 7,651,893 B2 | 1/2010 | Chen et al. | |
| 7,851,885 B2 | 12/2010 | Kim et al. | |
| 8,164,156 B2 | 4/2012 | Kim et al. | |
| 8,421,186 B2 | 4/2013 | Li et al. | |
| 8,492,871 B2 | 7/2013 | Yang et al. | |
| 8,629,050 B2 | 1/2014 | Thei et al. | |
| 8,698,275 B2 | 4/2014 | Barth et al. | |
| 2005/0247995 A1 | 11/2005 | Pitts et al. | |
| 2008/0093704 A1 | 4/2008 | Park et al. | |
| 2009/0243113 A1 | 10/2009 | Tuten et al. | |
| 2010/0252908 A1 | 10/2010 | Schlarmann | |
| 2011/0284988 A1 | 11/2011 | Shin et al. | |
| 2013/0071998 A1 | 3/2013 | Li et al. | |
| 2014/0167215 A1 | 6/2014 | Barth et al. | |

OTHER PUBLICATIONS

Rizzolo, R. F., et al., "IBM System z9 eFUSE applications and methodology", IBM J. Res. & Dev., Jan./Mar. 2007, vol. 51, No. 1/2.

* cited by examiner

E-FUSES CONTAINING AT LEAST ONE UNDERLYING TUNGSTEN CONTACT FOR PROGRAMMING

BACKGROUND

The present disclosure relates to a semiconductor structure and a method of forming the same. More particularly, the present disclosure relates to semiconductor structures including a fuse (E-fuse) that contains at least one underlying tungsten contact for programming and methods of forming the same.

Advanced semiconductor circuitry may use various programmable interconnect elements to connect logic blocks for a number of applications, such as electrically programmable feature selection, speed sorting, die identification, and redundancy implementation. For high-speed applications, the on-state of such structures should have a low resistance. To achieve a high density of such structures in an integrated circuit, the programmable elements should be small.

Programmable fuses are an example of a programmable element, wherein, for example, a fuse element, e.g., sacrificial metal lines buried in a dielectric layer in the circuits (which are normally closed) are blown by vaporizing the fuse element with laser energy to open the circuit that is not selected. Electrically programmable fuses may be used, for example, for chip ID, redundancy, and non-volatile memory programming.

Current electronic fuses may use melting and/or evaporation of material for programming. For example, programmable fuses fall into at least three categories depending on the method of programming. The first category includes laser-blown fuses where the programmable fuses are programmed using a laser to burn or sever the conductive portion of the fuse. The second category includes electrically blown fuses where the fuse is programmed by passing current through it sufficient to overload and open or burn out the fuse. The third category includes electrically blown anti-fuses, where the fuse is programmed with an electric current, which reduces the resistance across the fuse.

SUMMARY

The present disclosure provides semiconductor structures containing an electronic fuse (E-fuse) that includes a fuse element and at least one underlying tungsten contact that is used for programming the fuse element. In some embodiments, a pair of neighboring tungsten contacts is used for programming the fuse element. In another embodiment, an overlying conductive region can be used in conjunction with one of the underlying tungsten contacts to program the fuse element. In the disclosed structures, the fuse element is in direct contact with upper surfaces of a pair of underlying tungsten contacts. In one embodiment, the semiconductor structures may include an interconnect level located atop the fuse element. The interconnect level that is located atop the e-Fuse element includes a dielectric material that has a plurality of conductive regions embedded therein. In other embodiments, the fuse element is located within an interconnect level that is located atop the tungsten contacts. Specifically, and in such an embodiment, the fuse element is located within an opening that is formed in an interconnect dielectric material and is positioned between the underlying tungsten contacts and an overlying conductive material.

The terms "electronic fuse" or "eFuse" is used throughout the present application to denote a non-volatile storage element that includes either an antifuse, which is a programmable element that provides an initial high resistance and when blown provides a selective low resistance or short circuit; or a fuse, which is a programmable element that provides an initial low resistance and when blown provides a selective high resistance or open circuit.

In one embodiment of the present disclosure, a semiconductor structure including an E-fuse is provided. The semiconductor structure of this embodiment includes a plurality of tungsten contacts located within a dielectric material. A fuse element is located atop a portion of the dielectric material and spans a pair of neighboring tungsten contacts of the plurality of tungsten contacts. A dielectric capping layer is located atop the fuse element, the dielectric material and any remaining tungsten contacts of the plurality of tungsten contacts. An interconnect level is located atop the dielectric capping layer. The interconnect level includes another dielectric material having at least one conductive region located therein. In this structure, at least one of the tungsten contacts of the pair of neighboring tungsten contacts is used for programming the fuse element.

In another embodiment of the present disclosure, another semiconductor structure including an E-fuse is provided. The another semiconductor structure includes a plurality of tungsten contacts located within a dielectric material. An interconnect level is located atop the dielectric material. The interconnect level includes another dielectric material having an opening that includes a fuse element, an optional diffusion barrier, and a conductive material therein. The opening including the fuse element, the optional diffusion barrier, and the conductive material spans a pair of neighboring tungsten contacts of the plurality of tungsten contacts. In this embodiment of the present disclosure, the fuse element and the conductive material that are present within the opening are comprised of a different material. In this structure, at least one of the tungsten contacts of the pair of neighboring tungsten contacts is used for programming the fuse element.

In either embodiment mentioned above, no copper contacts are present within the dielectric material including the plurality of tungsten contacts. Since no copper contacts are located beneath the fuse element of the present disclosure, no copper contact is involved for programming the E-fuse. The e-Fuse within the semiconductor structures of the present disclosure thus has improved reliability as compared to prior art e-Fuse-containing structures that include copper contacts and, which used such copper contacts for programming.

The present disclosure also provided methods of forming the above mentioned semiconductor structures. In one embodiment, the method includes forming a plurality of tungsten contacts within a dielectric material. A fuse element is then formed atop a portion of the dielectric material and spanning a pair of neighboring tungsten contacts of the plurality of tungsten contacts. A dielectric capping layer is then formed atop the fuse element, the dielectric material and any remaining tungsten contacts of the plurality of tungsten contacts. An interconnect level is then formed atop the dielectric capping layer. The interconnect level includes another dielectric material having at least one conductive region located therein.

In another embodiment, the method includes forming a plurality of tungsten contacts within a dielectric material. An interconnect level is then formed atop the dielectric material. The interconnect level includes another dielectric material having an opening that includes a fuse element, an optional diffusion barrier and a conductive material formed therein. The opening including the fuse element, optional diffusion barrier and the conductive material spans a pair of neighboring tungsten contacts of the plurality of tungsten contacts. In this embodiment of the present disclosure, the fuse element and the conductive material that are present within the opening are comprised of a different material.

In either of the aforementioned method embodiments, the fuse element of the E-fuse-containing structures is formed prior to forming the conductive material of the interconnect level. As such, the present disclosure provides methods of forming E-fuse-containing structures that could widen the allowed thermal budget of the overall process.

DETAILED DESCRIPTION

Figure 1:
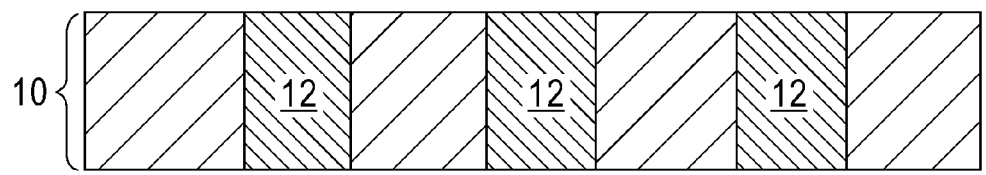
FIG. 1 is a pictorial representation (through a cross sectional view) illustrating an initial structure including a dielectric material having a plurality of tungsten contacts embedded therein that can be employed in one embodiment of the present disclosure.

The present disclosure, which provides semiconductor structures including an electronic fuse (E-fuse) that contains at least one underlying tungsten contact for programming and methods of forming the same, will now be described in greater detail by referring to the following discussion and drawings that accompany the present application. It is noted that the drawings of the present application are provided for illustrative purposes only and, as such, the drawings are not drawn to scale. It is also noted that in the drawings like and corresponding elements are referred to using like reference numerals.

In the following description, numerous specific details are set forth, such as particular structures, components, materials, dimensions, processing steps and techniques, in order to provide an understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the present disclosure.

It will be understood that when an element as a layer, region or substrate is referred to as being "atop", "on" or "over" another element, it can be directly on the other element or intervening elements may also be present. In contrast, when an element is referred to as being "directly atop", "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Reference is now made to FIG. 1, which illustrates an initial structure that can be employed in one embodiment of the present disclosure. Specifically, the initial structure shown in FIG. 1 includes a dielectric material 10 having a plurality of tungsten contacts 12 embedded.

The initial structure that is illustrated in FIG. 1 is located atop a substrate (not shown) which includes at least one active semiconductor device, such as, for example, a field effect transistor. In accordance with the present disclosure, the tungsten contracts are located atop a conductive region, e.g., gate conductor, of the at least one active semiconductor device.

In one embodiment of the present disclosure, the dielectric material 10, which can also be referred to as a middle-of-the-line (MOL) dielectric material, can be composed of, for example, silicon dioxide, undoped silicate glass (USG), fluorosilicate glass (FSG), borophosphosilicate glass (BPSG), a spin-on low-k dielectric layer, or a chemical vapor deposition (CVD) low-k dielectric layer. The term "low-k" as used throughout the present disclosure denotes a dielectric material that has a dielectric constant of less than silicon dioxide. The dielectric material 10 can be formed utilizing a conventional deposition process including, for example, chemical vapor deposition (CVD), plasma enhanced chemical vapor deposition (PECVD), evaporation and spin-on coating. The thickness of the dielectric material 10 that can be employed in the present disclosure may vary depending on the type of dielectric material employed as well as the method that was employed in forming the same. In one embodiment, the dielectric material 10 has a thickness from 80 nm to 500 nm. In another embodiment, the dielectric material 10 has a thickness from 100 nm to 400 nm. Other thicknesses that are greater or lesser than the ranges provided above can also be used for the dielectric material 10.

The initial structure also includes a plurality of tungsten contacts 12 located within the dielectric material 10. The number of tungsten contacts within the plurality of tungsten contacts 12 can vary so long as there are at least two neighboring tungsten contacts that are present in the structure.

As shown in FIG. 1, each tungsten contact of the plurality of tungsten contacts 12 has an upper surface that is coplanar with an upper surface of the dielectric material 10, and a bottom surface that is coplanar with a bottom surface of the dielectric material 10. In one embodiment, each tungsten contact of the plurality of tungsten contacts 12 can be composed of only, i.e., pure, tungsten. In another embodiment, each tungsten contact of the plurality of tungsten contacts 12 can be composed of tungsten and at least one other metal (such as, for example, Al, Cu, Rh, Ru, Co, and Ir) and/or impurity (such as, for example, Co, P, and B).

The plurality of tungsten contacts 12 that are present within the dielectric material 10 can be formed by first forming a plurality of contact via openings within the dielectric material 10. In some embodiments, at least one of the contact via openings of the plurality of contact via openings exposes an upper surface of a gate conductor of a field effect transistor. The contact via opening can be formed by lithography and etching. The lithography step includes applying a photoresist (not shown) atop the dielectric material 10 utilizing a conventional deposition process such as, for example, CVD, PECVD, spin-on coating, chemical solution deposition or evaporation. The photoresist may be a positive-tone material, a negative-tone material or a hybrid material, each of which is well known to those skilled in the art. The photoresist is then subjected to a lithographic process which includes exposing the photoresist to a pattern of radiation and developing the exposed resist utilizing a conventional resist developer. The lithographic step provides a patterned photoresist atop the dielectric material 10 that defines the width of each contact via opening to be subsequently formed into the dielectric material 10. After providing the patterned photoresist, the pattern is transferred into the dielectric material 10 utilizing one or more etching processes. The patterned photoresist can be stripped immediately after the pattern is transferred into the dielectric material 10 utilizing a conventional stripping process. The etch used in transferring the pattern from the patterned resist into the dielectric material 10 may comprise a dry etching process, a wet chemical etching process or a combination thereof. The term "dry etching" is used herein to denote an etching technique such as reactive-ion etching, ion beam etching, plasma etching or laser ablation.

In one embodiment of the present disclosure, the width of each of the contact via openings that are formed, as measured from a first sidewall to an opposing sidewall, is typically from 10 nm to 200 nm. In another embodiment of the present disclosure, the width of each of the contact via openings that are formed, as measured from a first sidewall to an opposing sidewall, is typically from 20 nm to 100 nm. Other widths for the contact via openings that are greater or lesser than the ranges provided above can also be employed in the present disclosure.

After providing the plurality of contact via openings within dielectric material 10, the plurality of tungsten contacts 12 can be formed by a deposition process including, for example, sputtering, plating, PECVD, CVD and physical vapor deposition (PVD). After depositing each tungsten contact of the plurality of tungsten contacts 12, a planarization process is employed to provide the planar structure shown in FIG. 1. The planarization process that can be used in providing the planar structure shown in FIG. 1 includes, for example, chemical mechanical polishing and/or grinding.

Figure 2:
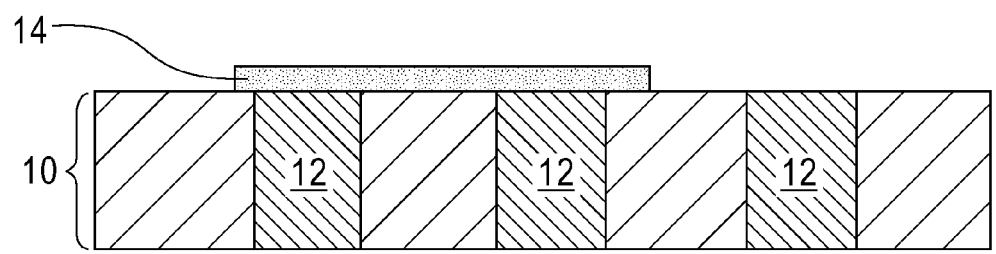
FIG. 2 is a pictorial representation (through a cross sectional view) illustrating the initial structure of FIG. 1 after forming a fuse element atop a pair of neighboring tungsten contacts.

Referring now to FIG. 2, there is illustrated the initial structure of FIG. 1 after forming a fuse element 14 atop a pair of neighboring tungsten contacts of the plurality of tungsten contacts 12. In one embodiment of the present disclosure, the fuse element 14 comprises Cu, Al, Si, Ge or alloys thereof, such as, for example, Cu—Al, Al—Si, and Si—Ge.

In another embodiment, the fuse element 14 is comprised of a phase change material. The term "phase change material" is used in the present disclosure to denote any resistive material that can be caused to change phase between an amorphous state and a crystalline state by application of electrical current at levels suitable for implementation in integrated circuits. The generally amorphous state is characterized by higher resistivity than the generally crystalline state, which can be readily sensed to indicate data. Examples of phase change materials that can be employed in the present disclosure include chalcogenides.

Chalcogenides include any of the four elements oxygen (O), sulfur (S), selenium (Se), and tellurium (Te), forming part of group VIA (CAS Version) of the Periodic Table of Elements. Chalcogenides comprise compounds of a chalcogen with a more electropositive element or radical. Chalcogenide alloys comprise combinations of chalcogenides with other materials such as transition metals. A chalcogenide alloy usually contains one or more elements from Group IVA (CAS Version) of the Periodic Table of Elements, such as germanium (Ge) and tin (Sn). Often, chalcogenide alloys include combinations including one or more of antimony (Sb), gallium (Ga), indium (In), and silver (Ag). Examples of chalcogenides that can be employed as the fuse element 14 include, but are not limited to, alloys of GaSb, InSb, InSe, SbTe, GeTe, GeSbTe, InSbTe, GaSeTe, SnSbTe, InSbGe, AgInSbTe, GeSnSbTe, GeSbSeTe and TeGeSbS.

In another embodiment, the fuse element 14 may include a metal oxide such as, for example, $TiO_2$ and NiO.

The fuse element 14 can be formed by first forming a blanket layer of one of the above mentioned resistive materials atop the structure shown in FIG. 1. The blanket layer of resistive material can be formed utilizing any conventional deposition process including, but not limited to, chemical vapor deposition, plasma enhanced chemical vapor deposition, sputtering, physical vapor deposition, chemical solution deposition, and atomic layer deposition (ALD). After forming the blanket layer of resistive material, the blanket layer of resistive material is patterned by lithography and etching into fuse element 14.

In one embodiment, the fuse element 14 has a thickness from 1 nm to 100 nm. In another embodiment, the fuse element 14 has a thickness from 5 nm to 50 nm. The length of the fuse element 14, as measured from one vertical sidewall edge to another vertical sidewall edge, is typically from 20 nm to 300 nm, with a length from 50 nm to 100 nm being more typical.

The vertical sidewall edges of the fuse element 14 may or may not be vertical coincident to a vertical sidewall edges of an underlying tungsten contact of the plurality of tungsten contacts 12. FIG. 2 illustrates an embodiment in which none of the vertical sidewall edges of the fuse element 14 are vertical coincident to the underlying vertical sidewall edges of any of the tungsten contacts of the plurality of tungsten contacts 12. In some embodiments, at least one vertical sidewall edge of the fuse element 14 can be vertical coincident to one vertical sidewall edge of an underlying tungsten contact of the plurality of tungsten contacts 12. In another embodiment, one vertical sidewall edge of the fuse element 14 can be vertical coincident to a vertical sidewall edge of one of the underlying tungsten contacts of the plurality of tungsten contacts 12, while the other vertical sidewall edge of the fuse element 14 can be vertical coincident to another vertical sidewall edge of a neighboring underlying tungsten contact of the plurality of tungsten contacts 12. In any of the embodiments mentioned above, the fuse element 14 spans a pair of neighboring tungsten contacts of the plurality of tungsten contacts 12. The phrase "pair of neighboring tungsten contacts" is used throughout the present disclosure to denote one tungsten contact and is nearest adjacent tungsten contact.

Figure 3:
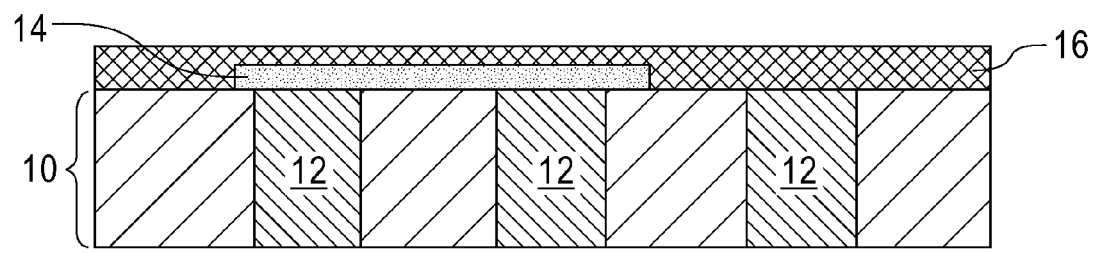
FIG. 3 is a pictorial representation (through a cross sectional view) illustrating the structure of FIG. 2 after forming a dielectric capping layer.

Referring now to FIG. 3, there is illustrated the structure of FIG. 2 after forming a dielectric capping layer 16. As is shown, the dielectric capping layer 16 is formed atop exposed surfaces of dielectric material 10, exposed surfaces of the fuse element 14, and, any remaining exposed surfaces of a tungsten contact of the plurality of tungsten contacts 12. The dielectric capping layer 16 that is employed in the present disclosure can be formed utilizing a conventional deposition process such as, for example, CVD, PECVD, chemical solution deposition, or evaporation. The dielectric capping layer 16 that is employed includes any suitable dielectric capping material such as, for example, SiC, $Si_4NH_3$, $SiO_2$, a carbon doped oxide, a nitrogen and hydrogen doped silicon carbide SiC(N,H) or multilayers thereof. The thickness of the dielectric capping layer 16 may vary depending on the technique used to form the same as well as the material make-up of the layer. In one embodiment, the dielectric capping layer 16 has a thickness from 15 nm to 200 nm. In another embodiment, the dielectric capping layer 16 has a thickness from 25 nm to 100 nm.

Figure 4:
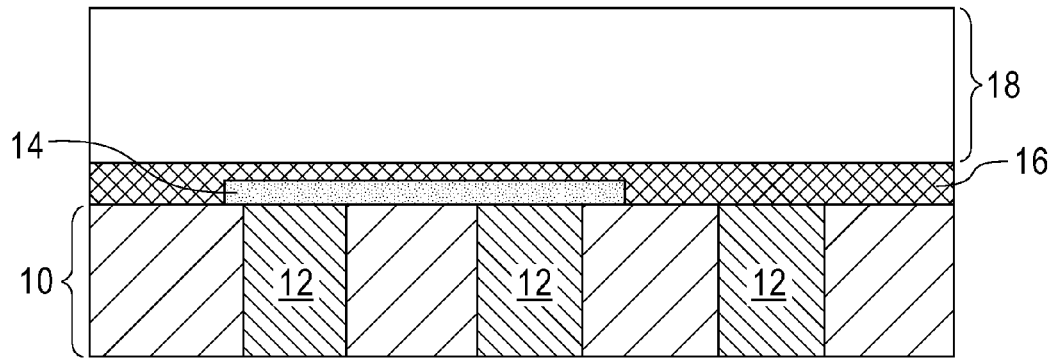
FIG. 4 is a pictorial representation (through a cross sectional view) illustrating the structure of FIG. 3 after forming another dielectric material.

Referring now to FIG. 4, there is illustrated the structure of FIG. 3 after forming another dielectric material 18. Specifically, the another dielectric material 18 is formed atop the dielectric capping layer 18. The another dielectric material 18 may be referred to as an interconnect dielectric material.

In one embodiment, the another dielectric material 18 may comprise the same dielectric material as dielectric material 10. In another embodiment, the another dielectric material 18 is comprised of a different dielectric material as dielectric material 10. For example and in some embodiments of the present disclosure, the dielectric material 10 can be composed of a dielectric oxide such as, for example, silicon oxide, while the another dielectric material 18 is composed of low-k dielectric material including, for example, a silsesquioxane, a C doped oxide (i.e., organosilicates) that include atoms of Si, C, O and H, a thermosetting polyarylene ether, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. In some embodiments, the another dielectric material 18 is non-porous. In yet other embodiments, the another dielectric material 18 is porous. By "porous" it is meant that the another dielectric material 18 has voids therein.

The another dielectric material 18, which is formed as a blanket layer atop the dielectric capping layer 16, can be formed utilizing a deposition process including, for example, chemical vapor deposition (CVD), plasma enhanced chemical vapor deposition (PECVD), evaporation, chemical solution deposition and spin-on coating. The thickness of the another dielectric material 18 may vary depending upon the type of dielectric material used as well as the exact number of dielectrics within the layer. In one embodiment, the another dielectric material 18 has a thickness from 50 nm to 500 nm. In yet another embodiment, the another dielectric material 18 has a thickness from 100 nm to 400 nm. Other thicknesses that are greater than or less than the aforementioned ranges can also be employed as the thickness of the another dielectric material 18 in the present disclosure.

Figure 5:
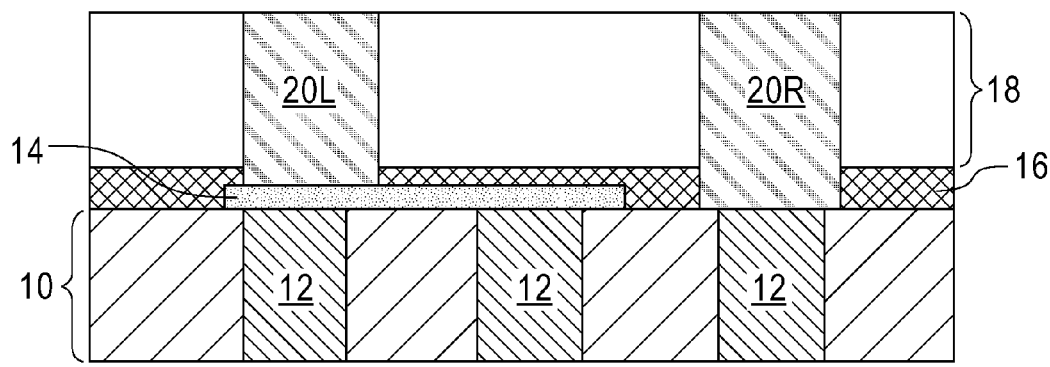
FIG. 5 is a pictorial representation (through a cross sectional view) illustrating the structure of FIG. 4 after formation of conductive regions embedded within the another dielectric material.

Referring to FIG. 5, there is illustrated the structure of FIG. 4 after formation of conductive regions 20L, 20R embedded within the another dielectric material 18. As shown, one of the conductive regions (i.e., conductive region 20L) contacts an upper surface of the fuse element 14, while another of the conductive regions (i.e., conductive region 20R) contacts an upper surface of one of the plurality of tungsten contacts 12. Conductive region 20R can be omitted in embodiments in which there is no unpaired tungsten contact. It is noted that the another dielectric material 18 and the conductive regions 20L, 20R form an interconnect level of the semiconductor structure of this embodiment of the present disclosure.

The conductive regions 20L, 20R can be formed by first providing a plurality of openings into the another dielectric material 18. The plurality of openings can be formed as described above for forming the contact via openings within dielectric material 10. After forming the plurality of openings within the another dielectric material 18, a conductive material is formed within the each of the openings. The conductive material may be formed by a deposition process including chemical vapor deposition (CVD), plasma enhanced chemical vapor deposition (PECVD), sputtering, chemical solution deposition or plating that fills the first and second interconnect patterns from the bottom upwards. In one embodiment, a bottom-up plating process is employed in forming the conductive material. Following the deposition of the conductive material, a planarization process such as, for example, chemical mechanical polishing (CMP) and/or grinding, can be used to provide the conductive regions 20L, 20R shown in FIG. 5. As is illustrated, the conductive regions 20L, 20R have an upper surface that is coplanar with an upper surface of the another dielectric material 18.

The conductive material that is used in forming the conductive regions 20L, 20R may comprise polySi, SiGe, a conductive metal, an alloy comprising at least one conductive metal, a conductive metal silicide or combinations thereof. In one embodiment, the conductive material is a conductive metal such as Cu, W or Al. In another embodiment, the conductive material is Cu or a Cu alloy (such as Cu—Al).

In some embodiments, especially when Cu or a Cu alloy is employed as the conductive material, an optional plating seed layer (not shown) can be formed prior to forming the conductive material. The optional plating seed layer is employed to selectively promote subsequent electroplating of a pre-selected conductive metal or metal alloy. The optional plating seed layer may comprise Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, and PVD.

The structure shown in FIG. 5 represents one semiconductor structure of the present disclosure. In this embodiment, the structure includes a plurality of tungsten contacts 12 located within a dielectric material 10; a fuse element 14 is located atop a portion of the dielectric material 10 and spanning a pair of neighboring tungsten contacts (e.g., the left and middle tungsten contacts shown in the drawings) of the plurality of tungsten contacts 12; a dielectric capping layer 16 is located atop the fuse element 14, the dielectric material 10 and any remaining tungsten contacts of the plurality of tungsten contacts 12; and an interconnect level is located atop the dielectric capping layer 16. The interconnect level includes another dielectric material 18 having at least one conductive region 20L, 20R located therein. In the structure shown in FIG. 5 each tungsten contact of the plurality of tungsten contacts 12 has an upper surface that is coplanar with an upper surface of dielectric material 10.

Figure 6A:
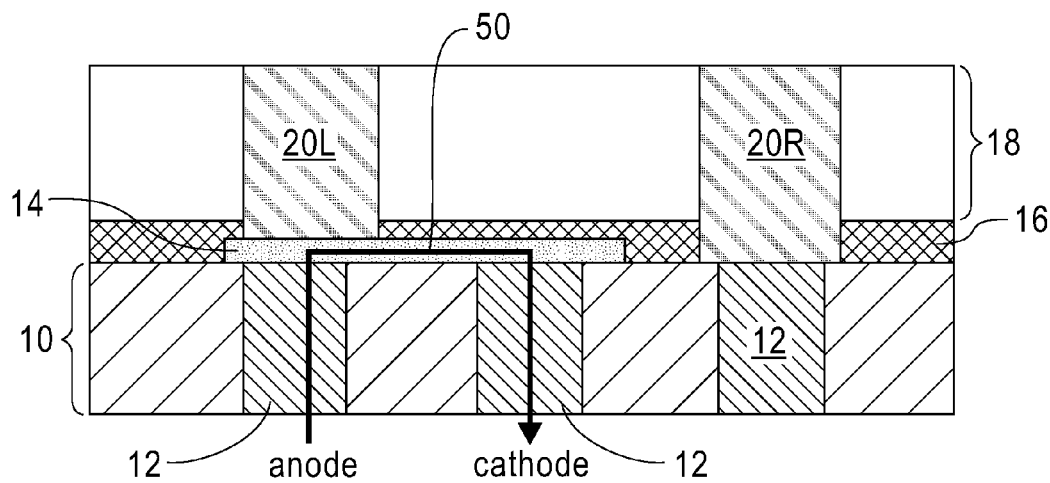
FIG. 6A is a pictorial representation (through a cross sectional view) depicting one programming mode for the structure shown in FIG. 5 that can be employed in the present disclosure.

In one embodiment, the E-fuse within the structure shown in FIG. 5 includes the pair of neighboring tungsten contacts (e.g., the left and middle tungsten contacts illustrated in the drawings) that are connected together, prior to programming, by the fuse element 14. One of the tungsten contacts of the pair of neighboring tungsten contacts serves as an anode of the E-fuse and the other tungsten contact of the pair of neighboring tungsten contacts serves as a cathode of the E-fuse. Such an embodiment is illustrated in FIG. 6A. Specifically, FIG. 6A illustrates one programming mode for the structure shown in FIG. 5. Element 50 depicted in FIG. 6A represents the programming current and the arrow illustrates the programming current direction. After programming, the pair of neighboring tungsten contacts becomes essentially disconnected due to an electrical resistance increase or even discontinuity within the fuse element 14.

Figure 6B:
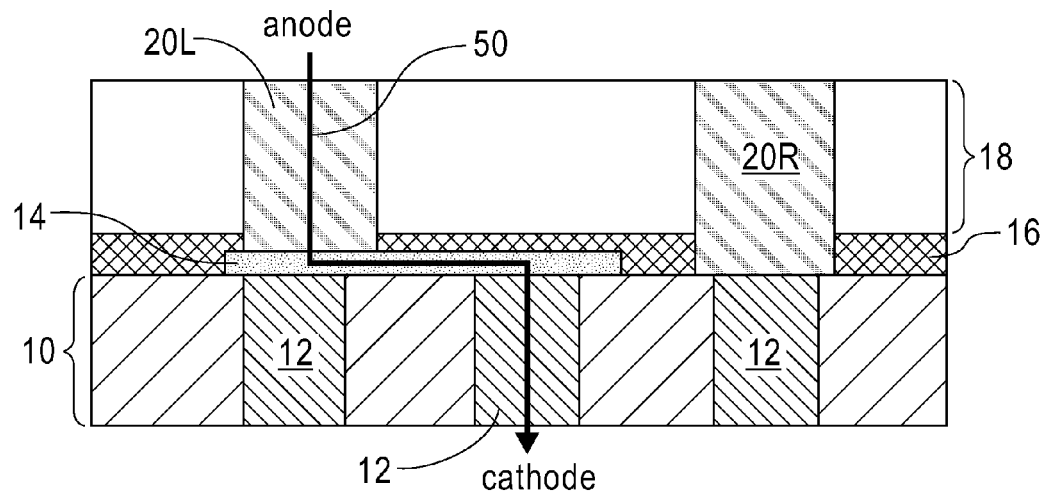
FIG. 6B is a pictorial representation (through a cross sectional view) depicting another programming mode for the structure shown in FIG. 5 that can be employed in the present disclosure.

In another embodiment, the E-fuse within the structure shown in FIG. 5 includes one of the tungsten contacts (e.g., the middle tungsten contact illustrated in the drawings) of the pair of neighboring tungsten contacts and the overlying conductive region 20L that are connected together, prior to programming, by the fuse element 14. In this embodiment, the conductive region 20L acts serves an anode of the E-fuse and the middle tungsten contact serves as a cathode of the E-fuse. Such an embodiment is illustrated in FIG. 6B. Specifically, FIG. 6B illustrates another programming mode for the structure shown in FIG. 5. Element 50 depicted in FIG. 6B represents the programming current and the arrow illustrates the programming current direction. It is observed that the programming direction shown in FIG. 6B enhances the E-fuse reliability. After programming, conductive region 20L and the middle tungsten contact 12 become essentially disconnected due to an electrical resistance increase or even discontinuity within the fuse element 14.

Figure 7:
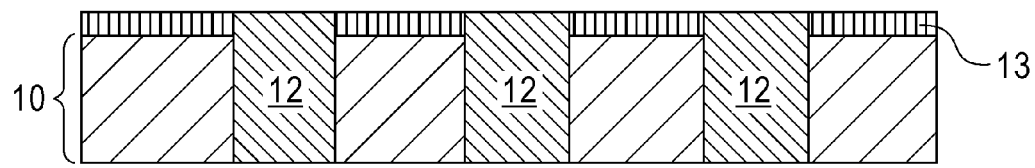
FIG. 7 is a pictorial representation (through a cross sectional view) illustrating an initial structure including a hard mask capped dielectric material having a plurality of tungsten contacts embedded therein that can be employed in another embodiment of the present disclosure.

Referring now to FIG. 7, there is illustrated an initial structure that can be employed in another embodiment of the present disclosure. The initial structure shown in FIG. 7 is the similar to the initial structure shown in FIG. 1 except that a hard mask 13 is formed atop the exposed surface of the dielectric material 10 prior to forming the plurality of via contact openings within the dielectric material 10. The hard mask 13 shown in FIG. 7 can include an oxide, a nitride, an oxynitride or any multilayered combination thereof. In one embodiment, the hard mask 13 is an oxide such as silicon dioxide, while in another embodiment the hard mask 13 is a nitride such as silicon nitride.

The hard mask 13 can be formed utilizing a conventional deposition process including, for example, chemical vapor deposition (CVD), plasma enhanced chemical vapor deposition (PECVD), chemical solution deposition, evaporation, and physical vapor deposition (PVD). Alternatively, the hard mask may be formed by one of thermal oxidation, and thermal nitridation.

The thickness of the hard mask 13 employed in the present disclosure may vary depending on the material of the hard mask itself as well as the techniques used in forming the same. In one embodiment, the hard mask 13 has a thickness from 5 nm to 100 nm. In another embodiment, the hard mask 13 has a thickness from 10 nm to 80 nm.

After forming the hard mask 13 atop the dielectric material, the plurality of tungsten contacts 12 are formed as described above in connection with FIG. 1. In the embodiment illustrated in FIG. 7, the upper surface of each tungsten contact of the plurality of tungsten contacts 12 is coplanar with an upper surface of the hard mask 13.

Figure 8:
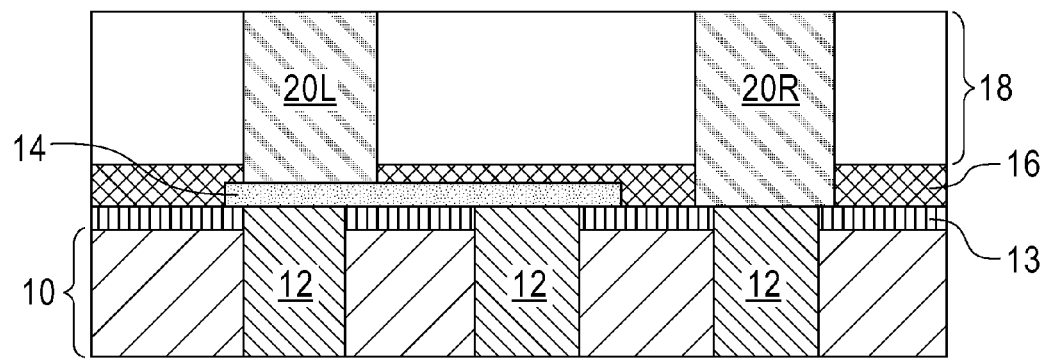
FIG. 8 is a pictorial representation (through a cross sectional view) illustrating the initial structure of FIG. 7 after formation of a fuse element, a dielectric capping layer, and another dielectric material that includes conductive regions embedded therein.

Referring now to FIG. 8, there is illustrated the structure of FIG. 7 after formation of a fuse element 14, a dielectric capping layer 16, and another dielectric material 18 that includes conductive regions 20L, 20R embedded therein. The fuse element 14, dielectric capping layer 18, the another dielectric material 18 and the conductive regions 20L, 20R employed in this embodiment of the present disclosure are the same as described above in FIGS. 2-5. As such, the above description with respect to the fuse element 14, dielectric capping layer 18, the another dielectric material 18 and the conductive regions 20L, 20R is incorporated herein by reference.

The structure shown in FIG. 8 represents another semiconductor structure of the present disclosure. In this embodiment, the structure includes a plurality of tungsten contacts 12 located within a dielectric material 10; a fuse element 14 is located atop a portion of the dielectric material 10 and spanning a pair of neighboring tungsten contacts of the plurality of tungsten contacts 12; a dielectric capping layer 16 is located atop the fuse element 14, the dielectric material 10 and any remaining tungsten contacts of the plurality of tungsten contacts 12; and an interconnect level is located atop the dielectric capping layer 16. The interconnect level includes another dielectric material 18 having at least one conductive region 20L, 20R located therein. In the structure shown in FIG. 7 a hard mask 13 is present atop the dielectric material 10. As such, each tungsten contact of the plurality of tungsten contacts 12 has an upper surface that is coplanar with an upper surface of the hard mask 13, instead of the dielectric material 10. It is noted that the semiconductor structure shown in FIG. 8 can also include the two E-fuses mentioned above which are also illustrated in FIGS. 6A and 6B.

Figure 9:
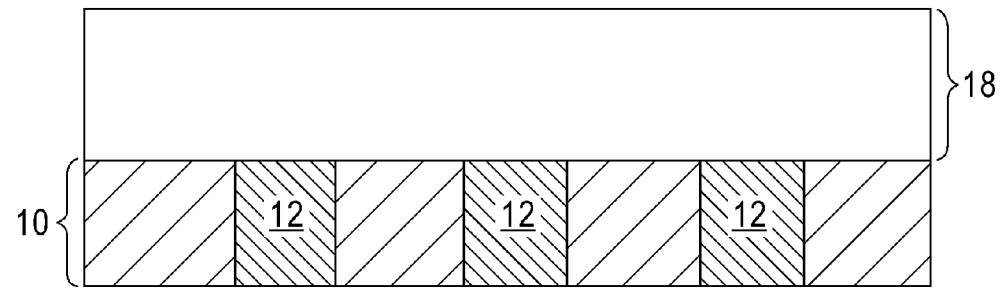
FIG. 9 is a pictorial representation (through a cross sectional view) illustrating the initial structure of FIG. 1 after formation of another dielectric material thereon in accordance with another embodiment of the present disclosure.

Reference is now made to FIG. 9 which illustrates another embodiment of the present disclosure in which another dielectric material 18 is formed on the initial structure illustrated in FIG. 1 of the present disclosure. In this embodiment, the another dielectric material 18 is the same as described above in FIG. 4. As such, the above description with respect to the another dielectric material 18 is incorporated herein by reference.

Figure 10:
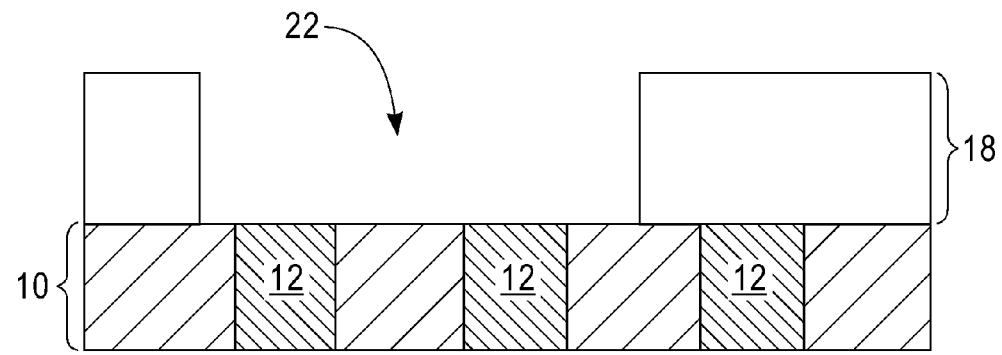
FIG. 10 is a pictorial representation (through a cross sectional view) illustrating the structure of FIG. 9 after forming an opening within the another dielectric material.

Referring now to FIG. 10, there is illustrated the structure of FIG. 9 after forming an opening 22 within the another dielectric material 18. As shown, the opening 22 spans a pair of neighboring tungsten contacts of the plurality of tungsten contacts 12 that are present in dielectric material 10. The opening 22 that is formed within the another dielectric material 18 can be formed utilizing the same technique as mentioned above in forming the plurality of via contact openings into dielectric material 10. The width of the opening 22, as measured from an exposed side wall of the another dielectric material 18 to an opposing side wall of the another dielectric material 18 is typically from 10 nm to 500 nm, with a width from 20 nm to 100 nm being more typical.

Figure 11:
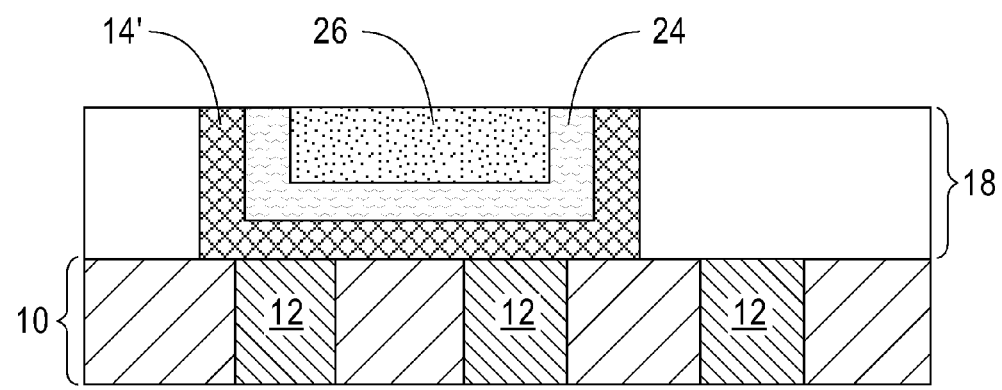
FIG. 11 is a pictorial representation (through a cross sectional view) illustrating the structure of FIG. 10 after formation of a fuse element, an optional diffusion barrier and a conductive region within the opening.

Referring now to FIG. 11, there is illustrated the structure of FIG. 10 after formation of a fuse element 14', an optional diffusion barrier 24 and a conductive region 26 within the opening 22. As is shown, the fuse element 14', the optional diffusion barrier 24 and the conductive region 26 are U-shaped and each has an upper surface that is coplanar with each other as well as with upper surface of the another dielectric layer 18.

After providing the opening 22, fuse element 14' is formed within the opening and on exposed surfaces of the another dielectric material 18, dielectric material 10 and a pair of neighboring tungsten contacts of the plurality of tungsten contacts 12. The fuse element 14' employed in this embodiment of the present disclosure includes one of the materials mentioned above for fuse element 14, with the proviso that the fuse element 14' is different from that of conductive material used in forming conductive region 24. The fuse element 14' can be formed utilizing one of the deposition process mentioned above in forming the fuse element 14. The thickness of the fuse element 14' is within the thickness range mentioned above for fuse element 14.

An optional diffusion barrier 24 may be formed atop the exposed upper surface of the fuse element 14'. The optional diffusion barrier 24 that can be employed in the present disclosure includes Ta, TaN, Ti, TiN, Ru, RuN, RuTa, RuTaN, W, WN or any other material that can serve as a barrier to prevent a conductive material from diffusing there through. The thickness of the optional diffusion barrier 24 may vary depending on the deposition process used as well as the material employed. Typically, the optional diffusion barrier 24 has a thickness from 2 nm to 50 nm, with a thickness from 5 nm to 20 nm being more typical. The optional diffusion barrier 24 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating.

After forming the fuse element 14' and the optional diffusion barrier 24, a conductive material is then formed within the remaining portion of the opening 22 providing the conductive region 26 to the structure. The conductive material used in forming the conductive region 26 includes one of the conductive materials mentioned above in forming conductive regions 20R, 20L. The conductive material used in forming the conductive region 26 includes one of the deposition processes mentioned above for forming the conductive material used in providing the conductive regions 20R, 20L. In some embodiments, and as mentioned above, an optional metal seed layer can be formed prior to forming the conductive material used in forming conductive region 26.

After forming the fuse element 14', the optional diffusion barrier 24 and the conductive material, the structure is subjected to a planarization process such as, for example, chemical mechanical polishing and/or grinding, providing the structure shown in FIG. 11. It is noted that another dielectric material 18 including the opening 22 that contains the fuse element 14', optional diffusion barrier 24, and the overlying conductive region 26 form an interconnect level of the structure of this embodiment of the present disclosure.

The structure shown in FIG. 11 represents a structure of the present disclosure. In this embodiment, the structure includes a plurality of tungsten contacts 12 located within a dielectric material 10; and an interconnect level located atop the dielectric material 10 and spanning atop two neighboring tungsten contacts of the plurality of tungsten contacts. The interconnect level includes another dielectric material 18 having an opening 22 that comprises a diffusion barrier 24, a fuse element 14' and a conductive material 26 located therein. As shown, the opening 22 including the diffusion barrier 24, the fuse element 14' and the conductive material 26 spans a pair of neighboring tungsten contacts of the plurality of tungsten contacts 12. In the structure shown in FIG. 11 each tungsten contact of the plurality of tungsten contacts 12 has an upper surface that is coplanar with an upper surface of dielectric material 10. It is noted that the semiconductor structure shown in FIG. 11 can also include the two E-fuses mentioned above which are also illustrated in FIGS. 6A and 6B.

The embodiment that is illustrated in FIGS. 9, 10 and 11 may include a hard mask located on the upper surface of the dielectric material 10. In such an instance, the initial structure shown in FIG. 13 could be used prior to forming the another dielectric material 18 thereon. In this embodiment, the hard mask has an upper surface that is coplanar with an upper surface of each tungsten contact of the plurality of tungsten contacts 12.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor structure, said method comprising:
    forming a plurality of tungsten contacts within a dielectric material;
    forming a fuse element atop a portion of the dielectric material and spanning a pair of neighboring tungsten contacts of the plurality of tungsten contacts, wherein said forming the fuse element comprises selecting a fuse element material, depositing said fuse element material, and patterning the fuse element material;
    forming a dielectric capping layer atop the fuse element, the dielectric material and any remaining tungsten contacts of the plurality of tungsten contacts; and
    forming an interconnect level atop the dielectric capping layer, said interconnect level comprising another dielectric material having at least one conductive region located therein.

2. The method of claim 1, wherein said fuse element material comprises Cu, Al, Si, Ge or alloys thereof.

3. The method of claim 1, wherein said fuse element material comprises at least one chalcogenide.

4. The method of claim 1, wherein said fuse element material comprises at least one metal oxide.

5. A method of forming a semiconductor structure, said method comprising:
    forming a plurality of tungsten contacts within a dielectric material; and
    forming an interconnect level atop the dielectric material, said interconnect level comprising another dielectric material having an opening that comprises a fuse element and an overlying conductive material formed therein, wherein said opening including the fuse element and the overlying conductive material spans a pair of neighboring tungsten contacts of the plurality of tungsten contacts, and wherein said fuse element and said conductive material are comprised of a different material.

6. The method of claim 5, wherein said forming the interconnect level comprises depositing said another dielectric material atop the dielectric material including the plurality of tungsten contacts located therein; forming said opening in said another dielectric material by lithography and etching; depositing said diffusion barrier; depositing said fuse element; depositing said conductive material; and planarizing.

7. The method of claim 5, wherein said fuse element material comprises Cu, Al, Si, Ge or alloys thereof.

8. The method of claim 5, wherein said fuse element material comprises at least one chalcogenide.

9. The method of claim 5, wherein said fuse element material comprises at least one metal oxide.

* * * * *